US009005407B2

(12) United States Patent
Jeng et al.

(10) Patent No.: US 9,005,407 B2
(45) Date of Patent: Apr. 14, 2015

(54) METHOD OF FABRICATING COMPOSITE FIELD EMISSION SOURCE

(75) Inventors: Jian-Min Jeng, Taipei (TW); Jyi-Tsong Lo, Taipei (TW); Wen-Ching Shih, Taipei (TW); Wei-Lung Tasi, Taipei (TW)

(73) Assignees: Tatung Company, Taipei (TW); Tatung University, Taipei (TW)

( * ) Notice: Subject to any disclaimer, the term of this patent is extended or adjusted under 35 U.S.C. 154(b) by 783 days.

(21) Appl. No.: 13/317,955

(22) Filed: Oct. 31, 2011

(65) Prior Publication Data
US 2012/0090986 A1   Apr. 19, 2012

Related U.S. Application Data

(62) Division of application No. 12/154,903, filed on May 27, 2008, now Pat. No. 8,080,929.

(30) Foreign Application Priority Data

Dec. 26, 2007 (TW) ............................... 96150312 A

(51) Int. Cl.
*C23C 16/26* (2006.01)
*H01J 9/02* (2006.01)
*C23C 16/455* (2006.01)
*H01J 1/304* (2006.01)

(52) U.S. Cl.
CPC ................. *H01J 9/025* (2013.01); *C23C 16/26* (2013.01); *C23C 16/45523* (2013.01); *H01J 1/304* (2013.01); *H01J 2201/30403* (2013.01); *H01J 2201/30461* (2013.01)

(58) Field of Classification Search
CPC ... C23C 16/26; C23C 16/45523; H01J 1/304; H01J 9/025; H01J 2201/30403; H01J 2201/30461
USPC .............. 204/192.12, 192.15; 427/77, 78, 122
See application file for complete search history.

(56) References Cited

U.S. PATENT DOCUMENTS

2007/0251815 A1* 11/2007 Lo et al. .................. 204/192.15

* cited by examiner

*Primary Examiner* — Rodney McDonald
(74) *Attorney, Agent, or Firm* — J.C. Patents

(57) ABSTRACT

A method of fabricating a composite field emission source is provided. A first stage of film-forming process is performed by using RF magnetron sputtering, so as to form a nano structure film on a substrate, in which the nano structure film is a petal-shaped structure composed of a plurality of nano graphite walls. Afterward, a second stage of film-forming process is performed for increasing carbon accumulation amount on the nano structure film and thereby growing a plurality of nano coral-shaped structures on the petal-shaped structure. Therefore, the composite field emission source with high strength and nano coral-shaped structures can be obtained, whereby improving the effect and life of electric field emission.

17 Claims, 3 Drawing Sheets

METHOD OF FABRICATING COMPOSITE FIELD EMISSION SOURCE

CROSS-REFERENCE TO RELATED APPLICATION

This application is a divisional application of and claims the priority benefit of an application Ser. No. 12/154,903, filed on May 27, 2008, now U.S. Pat. 8,080,929, which claims the priority benefit of Taiwan application serial no. 96150312, filed on Dec. 26, 2007. The entirety of each of the above-mentioned patent applications is hereby incorporated by reference herein and made a part of this specification.

BACKGROUND OF THE INVENTION

1. Field of the Invention

The present invention generally relates to a field emission source technology, in particular, to a method of fabricating a composite field emission source.

2. Description of Related Art

Display devices are playing an increasingly important role in people's daily life. Computers, TVs, mobile phones, PDAs, digital cameras etc., all transmit information by controlling display devices. Contrary to the conventional Cathode Ray Tube displays, the latest-generation panel displays are advantageous in that they are light, compact, and health-friendly.

Among various technologies for panel display devices, field emission displays (FED) boast not only great graphic qualities as found in conventional Cathode Ray Tube displays, but also high luminous efficiency, short response time, good display coordination performance, high brightness of more than 100 ftL, slim and light structure, wide viewing angle, broad range of working temperature, and high acting efficiency, contrary to Liquid Crystal Displays (LCD) which are problematic in narrow viewing angle, narrow working temperature range, and short response time. Besides, FEDs do not require backlight modules; they can provide superior brightness even when used in sunlight. Therefore, the current field emission displays has been regarded as a new display technology that is competitive against the LCD technology and even replace the LCD technology.

Recently, research in electric emitter of the FED trends mostly to carbon material, for example amorphous carbon film, diamond film, diamond-like carbon film, and carbon nanotube, and is mainly the carbon nanotube with low turn-on field of carbon nanotube. In addition, the carbon nanotube FED is self luminescent, so it can be applied to backlight source of the LCD or can serve as a flat panel light source.

However, the structure of the carbon nanotube cannot bear the high current and is easily to be burnt up, and when it is applied to screen printing process, field emission points of the carbon nanotube are disordered and dense, so it is difficult to control the emission current. Although in Taiwan patent application No. 95115215, the technology of fabricating the carbon nanotube by using radio frequency (RF) magnetron sputtering is provided to solve the problem that the carbon nanotube is easily to be burnt up due to over-high current, the turn-on field is still high.

SUMMARY OF THE INVENTION

Accordingly, the present invention is directed to a method of fabricating a composite field emission source, capable of preventing the problem of burn up due to over-high current, and reducing a turn-on field.

The present invention provides a method of fabricating a composite field emission source. Firstly, a first stage of film-forming process is performed by using RF magnetron sputtering, so as to form a nano structure film on a substrate, in which the nano structure film is a petal-shaped structure composed of a plurality of nano graphite walls. Afterward, a second stage of film-forming process is performed for increasing carbon accumulation amount on the nano structure film and thereby growing a plurality of nano coral-shaped structures on the petal-shaped structure.

In an embodiment of the present invention, if identical processing devices and gases are used, a temperature of the second stage of film-forming process must be higher than a temperature of the first stage of film-forming process.

In an embodiment of the present invention, the second stage of film-forming process includes a thermal deposition process, in which the thermal deposition process includes a thermal chemical vapor deposition (CVD) or a low pressure chemical vapor deposition (LPCVD).

In an embodiment of the present invention, a temperature of the thermal CVD is between 600° C. and 800° C., and a time of the thermal CVD is between 5 minutes and 30 minutes.

In an embodiment of the present invention, gases of the thermal CVD include $NH_3$ and a carbon containing gas, in which the carbon containing gas includes $C_2H_2$.

In an embodiment of the present invention, the second stage of film-forming process includes a plasma deposition process, in which the plasma deposition process includes a RF magnetron sputtering, a plasma enhanced chemical vapor deposition (PECVD), or a microwave plasma enhanced chemical vapor deposition (MPCVD).

In an embodiment of the present invention, a height of the nano graphite walls is micrometer level, and a thickness of the nano graphite walls is nano level.

In an embodiment of the present invention, the temperature of the first stage of film-forming process is between 350° C. and 500° C., a time of the first stage of film-forming process is between 5 minutes and 60 minutes, a pressure of the first stage of film-forming process is between 5 mtorr and 15 mtorr, and a power of the first stage of film-forming process is between 75 W and 200 W.

In an embodiment of the present invention, gases of the first stage of film-forming process include inert gas, $H_2$, and carbon containing gas.

In an embodiment of the present invention, the substrate includes a metal substrate, a semi-conductor substrate, a ceramic substrate or a glass substrate.

In the present invention, two stages of film-forming process are adopted, such that firstly the petal-shaped structure composed of the plurality of nano graphite walls can be formed on the substrate, and the carbon accumulation amount is increased by using the second stage of the film-forming process. In this manner, not only the strength of the composite field emission source is increased, such that the structure can bear high current, but also the turn-on field is lowered as the nano coral-shaped structures are grown during the second stage of film-forming process. Therefore, the fabrication method and the structure of the present invention can improve the effect and the life of the electric field emission.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
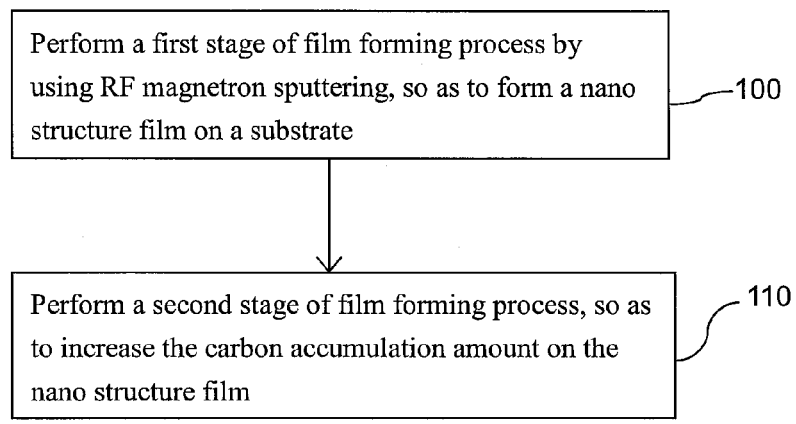
FIG. 1 is a flow chart of processes of fabricating a composite field emission source according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of processes of fabricating the composite field emission source according to a first embodiment of the present invention.

Referring to FIG. 1, step 100 is firstly performed, a first stage of film-forming process is performed by using RF magnetron sputtering, so as to form a nano structure film on a substrate, in which the substrate is, for example, a semiconductor substrate, a metal substrate, a ceramic substrate or a glass substrate. In the first embodiment, a temperature of the first stage of film-forming process is approximately between 350° C. and 500° C., a time of the first stage of film-forming process is between 5 minutes and 60 minutes, a pressure of the first stage of film-forming process is between 5 mtorr and 15 mtorr, and a power of the first stage of film-forming process is between 75 W and 200 W. The first stage of film-forming process in the first embodiment uses inert gas, $H_2$, and carbon containing gas as the processing gases. The detailed description of the first stage of film-forming process is similar to the technology provided by Taiwan patent application No. 95115215, but the parameters can be altered according to requirements and devices, and are not limited within the above scope. After the first stage of film-forming process, the nano structure film formed on the substrate is a petal-shaped structure composed of a plurality of nano graphite walls. For example, the height of the nano graphite wall is micrometer level, and the thickness of the nano graphite wall is nano level.

Then, in step 110, the second stage of film-forming process is performed, so as to increase the carbon accumulation amount on the nano structure film. Further, the temperature of the second stage of film-forming process is higher than the temperature of the first stage of film-forming process in step 100. The second stage of film-forming process is, for example, a thermal deposition process or a plasma deposition process, capable of increasing the carbon accumulation amount. The thermal deposition process is, for example, thermal CVD, LPCVD, or other suitable methods, and the plasma deposition process is, for example, RF magnetron sputtering, PECVD, MPCVD, or other suitable methods. For example, when the second stage of film-forming process is the thermal CVD, the processing temperature is approximately between 600° C. and 800° C., the time is approximately between 5 minutes and 30 minutes, and the processing gas is for example $NH_3$ and carbon containing gas, in which the carbon containing gas is, for example, $C_2H_2$. Further, when the second stage of film-forming process uses identical processing devices and gases as the first stage of film-forming process, the temperature of the second stage of film-forming process must be higher than the temperature of the first stage of film-forming process.

In the following, a group of experiments are given to prove the effects of the first embodiment of the present invention.

Experimental Example 1

After being cleaned, a silicon substrate is placed in a reactive RF magnetron sputtering system, and the temperature is controlled at 375° C. Then, gases required by the reaction are provided with controlled flow. In the experimental example 1, the provided gases are respectively Ar, $H_2$, and $CH_4$, and a gas flow ratio is 5: 3: 2.5. At the same time, the pressure is controlled at 10 mtorr. Then, a sputtering reaction is performed on the surface of the substrate for 50 minutes with a RF power 100 W, such that a nano structure film is grown on the surface of the silicon substrate.

Next, the silicon substrate grown with the nano structure film is moved into a furnace tube, the temperature of the furnace tube is controlled at 800° C., and then $NH_3$ and $C_2H_2$ are provided, in which the gas flows are respectively 100 sccm and 30 sccm. At the same time, the pressure is controlled at 3 torr, such that the thermal CVD reaction is performed on the substrate for 10 minutes, so as to increase the carbon accumulation amount on the nano structure film.

Experimental Example 2

After the surface of a silicon substrate is cleaned, the first stage of film-forming process is finished by using the reactive RF magnetron sputtering system and processing parameters identical to those of the [Experimental Example 1]. Then, the second stage of film-forming process is performed by using RF magnetron sputtering, in which the temperature is controlled to be higher than or equal to 400° C.

Comparative Examples 1-2

The reactive RF magnetron sputtering system and processing parameters identical to those of the [Experimental Example 1] are used, but a single stage film forming process is respectively finished under 375° C. and 400° C.

Figure 2:
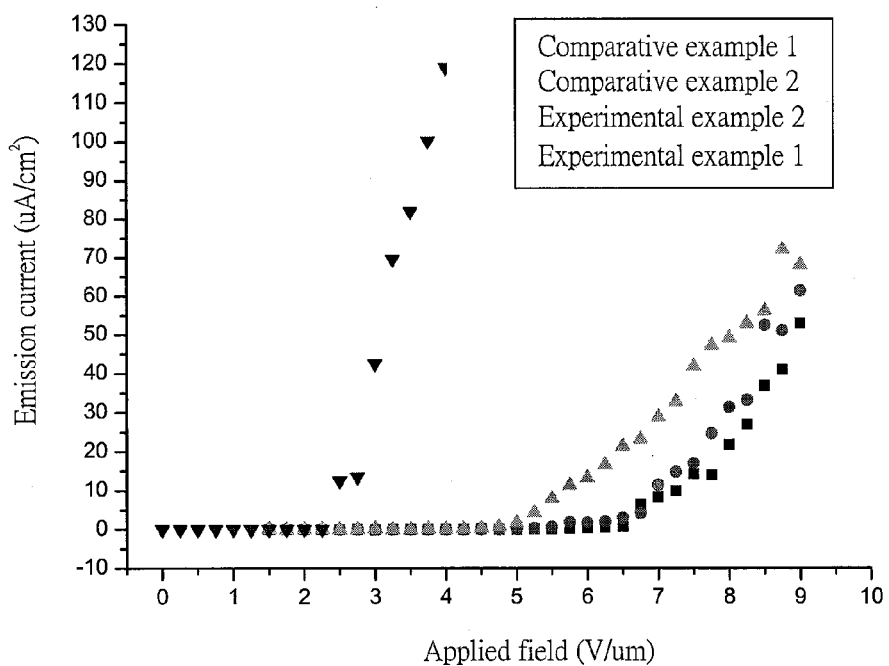
FIG. 2 is a curve diagram of the electric measurement of the composite field emission source fabricated according to the method of the first embodiment and by using a single stage film forming process.

The result is as shown in FIG. 2, a curve diagram of the relation between the emission current and the applied field of the experimental examples 1-2 and the comparative examples 1-2 is shown. It can be known from FIG. 2 that the experimental examples 1-2 fabricated according to the method of the present invention is distinctively superior to the single stage film forming process.

Figure 3A:
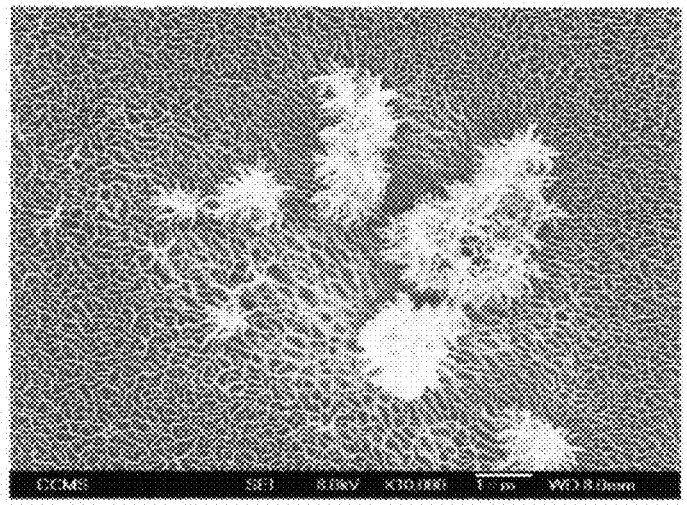
FIG. 3A is a scanning electron microscope (SEM) photograph of the composite field emission source of an experimental example 1.
Figure 3B:
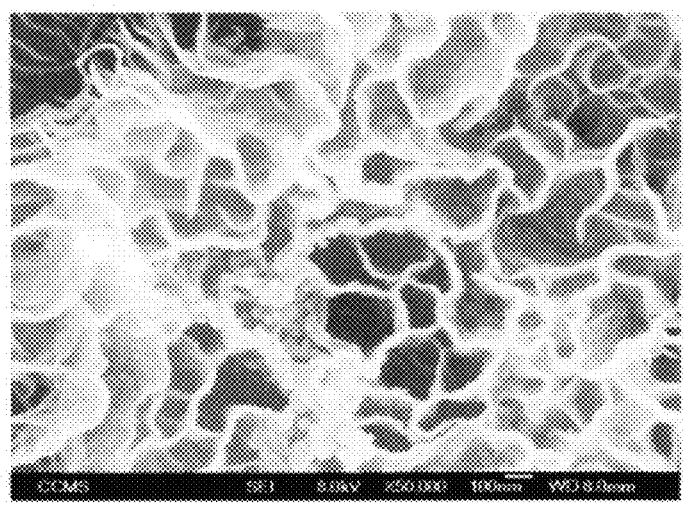
FIG. 3B is a partially enlarged SEM photograph of FIG. 3A.

In addition, FIG. 3A is a SEM photograph of the composite field emission source of the [Experimental Example 1], and FIG. 3B is a partially enlarged SEM photograph of FIG. 3A. The composite field emission source of the second embodiment of the present invention can be obtained from FIGS. 3A and 3B.

The composite field emission source of the second embodiment of the present invention is a nano structure film formed on the substrate, in which the nano structure film is a petal-shaped structure composed of a plurality of nano graphite walls, and the nano structure film includes a flat region (as the upper portion of the photograph in FIG. 3A) and a plurality of nano coral-shaped structures. FIG. 3B is an enlarged view of the nano coral-shaped structures, and it can be viewed from FIG. 3B that the nano coral-shaped structures are grown on the flat region and it seems that the nano graphite walls around the nano coral-shaped structures are eroded and have their shape changed, therefore it is predicted that at least a portion of the eroded carbon is deposited on the nano coral-shaped structures. A height difference between the flat region and the nano coral-shaped structures of the nano structure film is approximately micrometer level, and the height of the flat region of the nano structure film is approximately micrometer level.

Figure 4:
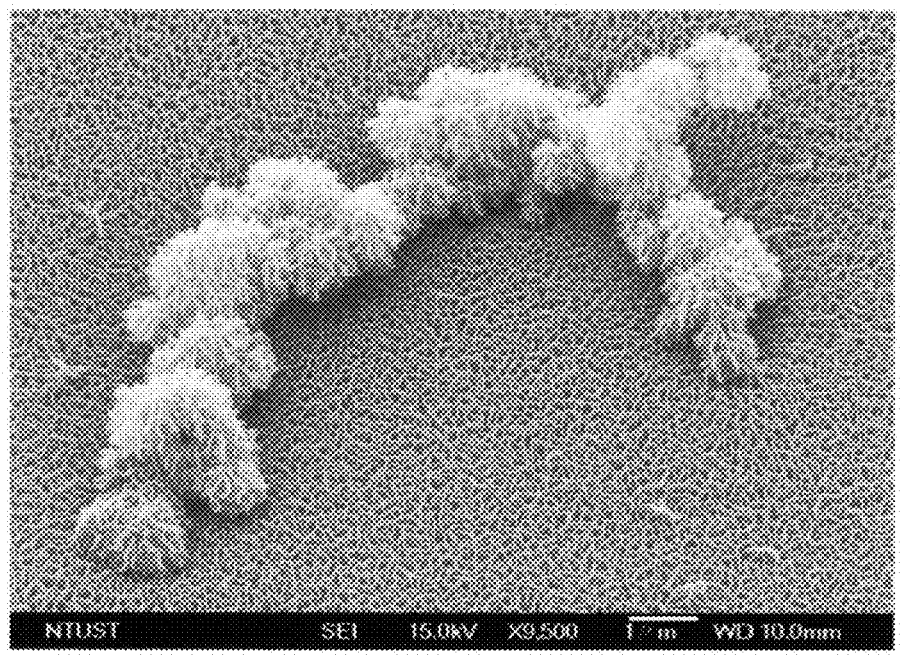
FIG. 4 is an SEM photograph of the composite field emission source obtained by repeating the experimental example 1.

In addition, in order to prove the repeatability of the method of the present invention, the process of the [Experimental Example 1] is repeated, so as to still obtain the composite field emission source with the nano coral-shaped structures, as the SEM photograph as shown in FIG. 4.

To sum up, the features of the present invention are as follows.

1. The two stages of film-forming process are adopted, so in the nano structure film formed by the present invention, the carbon accumulation amount increased in the second stage of film-forming process makes the nano graphite wall have thick thickness and high strength, so as to improve the life of the field emission source. Therefore, even if the FED is performed after the nano structure film obtained by growing is scraped from the substrate, the high-current resistance property is improved because of the advantage of the high strength of the nano graphite wall.

2. In the nano structure film of the present invention, because of the nano coral-shaped structures grown on the flat region of the uniform nano structure film, the turn-on field of the field emission source can be greatly reduced through the nano coral-shaped structures with large aspect ratio. Therefore, the structure of the present invention can improve the emission effect of the electric field.

3. The nano structure film of the present invention can not only be applied to the FED, but also be applied to field emission light source, for example, the backlight source of the LCD or the flat panel light source.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a composite field emission source, comprising:
performing a first stage of film-forming process by using a radio frequency (RF) magnetron sputtering, so as to form a nano structure film on a substrate, wherein the nano structure film comprises a petal-shaped structure composed of a plurality of nano graphite walls; and
performing a second stage of film-forming process, so as to increase a carbon accumulation amount on the nano structure film and thereby growing a plurality of nano coral-shaped structures on the petal-shaped structure.

2. The method of fabricating a composite field emission source according to claim 1, wherein the second stage of film-forming process comprises a thermal deposition process.

3. The method of fabricating a composite field emission source according to claim 1, wherein the thermal deposition process comprises a thermal chemical vapor deposition (CVD) or a low pressure chemical vapour deposition (LPCVD).

4. The method of fabricating a composite field emission source according to claim 3, wherein a temperature of the thermal CVD is between 600° C. and 800° C.

5. The method of fabricating a composite field emission source according to claim 3, wherein a time of the thermal CVD is between 5 minutes and 30 minutes.

6. The method of fabricating a composite field emission source according to claim 3, wherein gases of the thermal CVD comprise $NH_3$ and a carbon containing gas.

7. The method of fabricating a composite field emission source according to claim 6, wherein the carbon containing gas comprises $C_2H_2$.

8. The method of fabricating a composite field emission source according to claim 1, wherein the second stage of film-forming process comprises a plasma deposition process.

9. The method of fabricating a composite field emission source according to claim 8, wherein the plasma deposition process comprises a RF magnetron sputtering, a plasma enhanced chemical vapour deposition (PECVD), or a microwave plasma enhanced chemical vapour deposition (MPCVD).

10. The method of fabricating a composite field emission source according to claim 1, wherein when the second stage of film-forming process uses identical processing devices and gases as the first stage of film-forming process, a temperature of the second stage of film-forming process is higher than a temperature of the first stage of film-forming process.

11. The method of fabricating a composite field emission source according to claim 1, wherein a height of the nano graphite walls is micrometer level, and a thickness of the nano graphite walls is nano level.

12. The method of fabricating a composite field emission source according to claim 1, wherein the temperature of the first stage of film-forming process is between 350° C. and 500° C.

13. The method of fabricating a composite field emission source according to claim 1, wherein a time of the first stage of film-forming process is between 5 minutes and 60 minutes.

14. The method of fabricating a composite field emission source according to claim 1, wherein a pressure of the first stage of film-forming process is between 5 mtorr and 15 mtorr.

15. The method of fabricating a composite field emission source according to claim 1, wherein a power of the first stage of film-forming process is between 75 W and 200 W.

16. The method of fabricating a composite field emission source according to claim 1, wherein gases of the first stage of film-forming process comprise an inert gas, $H_2$, and a carbon containing gas.

17. The method of fabricating a composite field emission source according to claim 1, wherein the substrate comprises a semiconductor substrate, a metal substrate, a ceramic substrate or a glass substrate.

* * * * *